US012126307B2

(12) United States Patent
Balteanu et al.

(10) Patent No.: US 12,126,307 B2
(45) Date of Patent: Oct. 22, 2024

(54) POWER AMPLIFIER MODULES WITH CONTROLLABLE ENVELOPE TRACKING NOISE FILTERS

(71) Applicant: Skyworks Solutions, Inc., Irvine, CA (US)

(72) Inventors: Florinel G. Balteanu, Irvine, CA (US); Serge Francois Drogi, Flagstaff, AZ (US); Robert John Thompson, Cedar Rapids, IA (US); Shayan Farahvash, Kensington, CA (US); David Richard Pehlke, Westlake Village, CA (US); Stephan Henzler, Munich (DE)

(73) Assignee: Skyworks Solutions, Inc., Irvine, CA (US)

( * ) Notice: Subject to any disclaimer, the term of this patent is extended or adjusted under 35 U.S.C. 154(b) by 587 days.

(21) Appl. No.: 17/445,179

(22) Filed: Aug. 16, 2021

(65) Prior Publication Data

US 2022/0069775 A1 Mar. 3, 2022

Related U.S. Application Data

(60) Provisional application No. 62/706,579, filed on Aug. 26, 2020.

(51) Int. Cl.
*H03F 1/30* (2006.01)
*H03F 1/02* (2006.01)
*H03F 3/24* (2006.01)
*H04B 1/40* (2015.01)

(52) U.S. Cl.
CPC .......... *H03F 1/0238* (2013.01); *H03F 3/245* (2013.01); *H04B 1/40* (2013.01); *H03F 2200/105* (2013.01); *H03F 2200/165* (2013.01); *H03F 2200/451* (2013.01)

(58) Field of Classification Search
CPC .................................... H03F 1/30; H03G 3/20
USPC .......................................... 330/297, 129, 136
See application file for complete search history.

(56) References Cited

U.S. PATENT DOCUMENTS

| | | |
|---|---|---|
| 5,545,849 A | 8/1996 | Kondo |
| 5,966,051 A | 10/1999 | Griffith et al. |
| 6,255,906 B1 | 7/2001 | Eidson et al. |
| 6,529,716 B1 | 3/2003 | Eidson et al. |
| 6,681,101 B1 | 1/2004 | Eidson et al. |
| 6,720,839 B1 | 4/2004 | Torre et al. |
| 6,952,567 B2 | 10/2005 | Sowlati |
| 7,082,169 B2 | 7/2006 | Rozenblit et al. |
| 7,091,790 B2 | 8/2006 | Doherty et al. |
| 7,142,053 B2 | 11/2006 | Phillips et al. |
| 7,542,741 B2 | 6/2009 | Rozenblit et al. |
| 7,742,748 B2 * | 6/2010 | Matero ................ H04B 1/0475 330/149 |

(Continued)

*Primary Examiner* — Henry Choe
(74) *Attorney, Agent, or Firm* — Knobbe, Martens, Olson & Bear, LLP

(57) ABSTRACT

Power amplifier modules with controllable envelope tracking noise filters are provided herein. In certain embodiments, an envelope tracking system includes a power amplifier module and an envelope tracker that provides the power amplifier module with a power amplifier supply voltage that changes based on an envelope of a radio frequency (RF) signal amplified by the power amplifier module. The power amplifier module includes a controllable filter that filters the power amplifier supply voltage to provide flexibility in filtering envelope tracking noise.

20 Claims, 11 Drawing Sheets

(56) References Cited

U.S. PATENT DOCUMENTS

| | | | |
|---|---|---|---|
| 7,965,140 B2 * | 6/2011 | Takahashi | H03F 1/0227 330/297 |
| 8,089,312 B2 * | 1/2012 | Okayama | H04B 1/18 330/51 |
| 8,587,377 B2 | 11/2013 | Khesbak et al. | |
| 8,598,950 B2 | 12/2013 | Khesbak | |
| 8,717,100 B2 | 5/2014 | Reisner et al. | |
| 8,718,188 B2 | 5/2014 | Balteanu et al. | |
| 8,773,200 B2 * | 7/2014 | Severson | H03G 1/04 330/297 |
| 8,786,373 B2 * | 7/2014 | Presti | H03F 1/0211 330/297 |
| 8,797,103 B2 | 8/2014 | Kaczman et al. | |
| 8,803,615 B2 * | 8/2014 | Cabanillas | H03F 1/565 330/305 |
| 8,874,051 B2 | 10/2014 | Rozenblit et al. | |
| 8,981,847 B2 | 3/2015 | Balteanu | |
| 8,989,682 B2 | 3/2015 | Ripley et al. | |
| 9,088,249 B2 | 7/2015 | Kaczman et al. | |
| 9,118,277 B2 | 8/2015 | Balteanu et al. | |
| 9,143,096 B2 | 9/2015 | Balteanu et al. | |
| 9,209,770 B2 | 12/2015 | Rozenblit et al. | |
| 9,257,940 B2 | 2/2016 | Khesbak | |
| 9,294,043 B2 | 3/2016 | Ripley et al. | |
| 9,294,054 B2 | 3/2016 | Balteanu et al. | |
| 9,331,653 B2 | 5/2016 | Khesbak et al. | |
| 9,445,371 B2 | 9/2016 | Khesbak et al. | |
| 9,455,669 B2 | 9/2016 | Modi et al. | |
| 9,503,025 B2 | 11/2016 | Cao et al. | |
| 9,548,702 B2 | 1/2017 | Khesbak | |
| 9,559,808 B2 | 1/2017 | Rozenblit et al. | |
| 9,571,152 B2 | 2/2017 | Ripley et al. | |
| 9,584,070 B2 | 2/2017 | Balteanu et al. | |
| 9,602,056 B2 | 3/2017 | Lehtola | |
| 9,621,111 B2 | 4/2017 | Khesbak et al. | |
| 9,668,215 B2 | 5/2017 | Balteanu et al. | |
| 9,806,676 B2 | 10/2017 | Balteanu et al. | |
| 9,813,029 B2 | 11/2017 | Zhu et al. | |
| 9,859,853 B2 | 1/2018 | Kaczman | |
| 9,866,176 B2 | 1/2018 | Khesbak et al. | |
| 9,876,473 B2 | 1/2018 | Khesbak et al. | |
| 9,876,478 B2 | 1/2018 | Modi et al. | |
| 9,893,682 B2 | 2/2018 | Zhu et al. | |
| 9,935,582 B2 | 4/2018 | Balteanu et al. | |
| 9,973,148 B2 | 5/2018 | Zhu et al. | |
| 9,973,370 B1 * | 5/2018 | Langer | H03F 1/3258 |
| 9,991,850 B2 | 6/2018 | Lehtola | |
| 9,991,856 B2 | 6/2018 | Khesbak et al. | |
| 10,063,343 B2 | 8/2018 | Rozenblit et al. | |
| 10,080,192 B2 | 9/2018 | Balteanu et al. | |
| 10,103,693 B2 | 10/2018 | Zhu et al. | |
| 10,110,169 B2 | 10/2018 | Khesbak et al. | |
| 10,135,408 B2 | 11/2018 | Cao et al. | |
| 10,164,582 B2 | 12/2018 | Zhu et al. | |
| 10,181,820 B2 | 1/2019 | Balteanu et al. | |
| 10,205,426 B2 | 2/2019 | Zhu et al. | |
| 10,236,831 B2 | 3/2019 | Khesbak et al. | |
| 10,270,394 B2 | 4/2019 | Drogi et al. | |
| 10,277,177 B2 | 4/2019 | Khesbak et al. | |
| 10,320,345 B2 | 6/2019 | Sharma et al. | |
| 10,333,470 B2 | 6/2019 | Balteanu et al. | |
| 10,381,983 B2 | 8/2019 | Balteanu et al. | |
| 10,381,985 B2 | 8/2019 | Zhu et al. | |
| 10,382,147 B2 | 8/2019 | Ripley et al. | |
| 10,439,558 B2 | 10/2019 | Sharma et al. | |
| 10,447,207 B2 | 10/2019 | Zhu et al. | |
| 10,454,428 B2 | 10/2019 | Khesbak et al. | |
| 10,454,429 B2 | 10/2019 | Balteanu et al. | |
| 10,477,550 B2 | 11/2019 | Balteanu | |
| 10,516,368 B2 | 12/2019 | Balteanu et al. | |
| 10,536,116 B2 | 1/2020 | Balteanu et al. | |
| 10,574,191 B2 | 2/2020 | Zhu et al. | |
| 10,574,192 B2 | 2/2020 | Zhu et al. | |
| 10,615,757 B2 | 4/2020 | Balteanu et al. | |
| 10,642,296 B2 | 5/2020 | Gebeyehu et al. | |
| 10,651,802 B2 | 5/2020 | Khesbak et al. | |
| 10,666,200 B2 | 5/2020 | Gebeyehu et al. | |
| 10,784,819 B2 | 9/2020 | Sharma et al. | |
| 10,804,866 B2 | 10/2020 | Lehtola | |
| 10,804,867 B2 | 10/2020 | Lehtola et al. | |
| 10,812,023 B2 | 10/2020 | Balteanu et al. | |
| 10,812,026 B2 | 10/2020 | Zhu et al. | |
| 10,862,430 B2 | 12/2020 | Drogi et al. | |
| 10,873,297 B2 | 12/2020 | Khesbak et al. | |
| 10,958,218 B2 | 3/2021 | Gebeyehu et al. | |
| 10,985,703 B2 | 4/2021 | Balteanu et al. | |
| 10,985,711 B2 | 4/2021 | Balteanu et al. | |
| 11,038,471 B2 | 6/2021 | Drogi et al. | |
| 11,082,021 B2 | 8/2021 | Lin et al. | |
| 2008/0074187 A1 * | 3/2008 | Chen | H03F 3/45188 330/252 |
| 2016/0099686 A1 | 4/2016 | Perreault et al. | |
| 2017/0005624 A1 | 1/2017 | Zhu et al. | |
| 2017/0005626 A1 | 1/2017 | Zhu et al. | |
| 2018/0076772 A1 | 3/2018 | Khesbak et al. | |
| 2018/0159476 A1 | 6/2018 | Balteanu et al. | |
| 2018/0159478 A1 | 6/2018 | Balteanu et al. | |
| 2018/0331657 A1 | 11/2018 | Zhu et al. | |
| 2018/0375476 A1 | 12/2018 | Balteanu et al. | |
| 2019/0319720 A1 | 10/2019 | Ripley et al. | |
| 2019/0363684 A1 | 11/2019 | Sharma et al. | |
| 2020/0127619 A1 | 4/2020 | Khesbak et al. | |
| 2020/0136561 A1 | 4/2020 | Khlat et al. | |
| 2020/0162028 A1 | 5/2020 | Balteanu et al. | |
| 2020/0336110 A1 | 10/2020 | Drogi et al. | |
| 2020/0350866 A1 | 11/2020 | Pehlke | |
| 2020/0350878 A1 | 11/2020 | Drogi et al. | |
| 2021/0028800 A1 | 1/2021 | Balteanu et al. | |
| 2021/0028870 A1 | 1/2021 | Balteanu et al. | |
| 2021/0075373 A1 | 3/2021 | Sharma et al. | |
| 2021/0099133 A1 | 4/2021 | Drogi et al. | |
| 2021/0099134 A1 | 4/2021 | Drogi et al. | |
| 2021/0099135 A1 | 4/2021 | Balteanu et al. | |
| 2021/0099136 A1 | 4/2021 | Drogi et al. | |
| 2021/0099137 A1 | 4/2021 | Drogi et al. | |
| 2021/0104989 A1 | 4/2021 | Lehtola et al. | |
| 2021/0119592 A1 | 4/2021 | Drogi et al. | |
| 2021/0167733 A1 | 6/2021 | Drogi et al. | |
| 2021/0167734 A1 | 6/2021 | Khesbak et al. | |
| 2021/0184632 A1 | 6/2021 | Gebeyehu et al. | |
| 2021/0218370 A1 | 7/2021 | Balteanu et al. | |
| 2021/0234512 A1 | 7/2021 | Balteanu et al. | |
| 2021/0273614 A1 | 9/2021 | Drogi et al. | |

* cited by examiner

POWER AMPLIFIER MODULES WITH CONTROLLABLE ENVELOPE TRACKING NOISE FILTERS

CROSS-REFERENCE TO RELATED APPLICATIONS

This application claims the benefit of priority under 35 U.S.C. § 119 of U.S. Provisional Patent Application No. 62/706,579, filed Aug. 26, 2020 and titled "POWER AMPLIFIER MODULES WITH CONTROLLABLE ENVELOPE TRACKING NOISE FILTERS," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or to provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

SUMMARY

In certain embodiments, the present disclosure relates to an envelope tracking system. The envelope tracking system includes an envelope tracker configured to generate a power amplifier supply voltage that changes in relation to an envelope of a radio frequency signal, and a power amplifier module including a power amplifier configured to amplify the radio frequency signal and to receive power from the power amplifier supply voltage, the power amplifier module further including a controllable filter configured to filter the power amplifier supply voltage to provide envelope tracking noise filtering.

In various embodiments, the controllable filter includes a plurality of circuit branches that are selectable. According to a number of embodiments, each of the circuit branches includes a switch for selecting the circuit branch. In accordance with several embodiments, the plurality of circuit branches includes a plurality of series inductor-capacitor networks. According to some embodiments, the plurality of circuit branches includes a plurality of series resistor-inductor-capacitor networks. In accordance with a number of embodiments, the plurality of circuit branches includes a plurality of series resistor-capacitor networks.

In several embodiments, an amount of filtering provided by the controllable filter changes based on a signal characteristic of the radio frequency signal. According to certain embodiments, the signal characteristic is bandwidth. In accordance with a number of embodiments, the signal characteristic is a waveform type.

In some embodiments, an amount of filtering provided by the controllable filter changes based on a number of resource blocks allocated to the radio frequency signal.

In various embodiments, the power amplifier module is configured to receive data over an interface for programming a setting of the controllable filter.

In several embodiments, the envelope tracker includes a DC-to-DC converter configured to output a plurality of regulated voltages, a modulator configured to generate a modulator output voltage at an output based on the plurality of regulated voltages and the envelope of the radio frequency signal, and a modulator output filter coupled between the output of the modulator and the power amplifier supply voltage. According to a number of embodiments, a filtering characteristic of the modulator output filter is controllable. In accordance with various embodiments, each of the plurality of switches is connected between the output of the modulator and a corresponding one of the plurality of regulated voltages.

In some embodiments, the envelope tracker includes a DC-to-DC converter and an error amplifier configured to operate in parallel with one another to generate the power amplifier supply voltage. According to various embodiments, the error amplifier is included on the power amplifier module, and the DC-to-DC converter is external to the power amplifier module.

In certain embodiments, the present disclosure relates to a method of envelope tracking in a mobile device. The method includes generating a power amplifier supply voltage that changes in relation to an envelope of a radio frequency signal using an envelope tracker, amplifying the radio frequency signal using a power amplifier of a power amplifier module, powering the power amplifier using the power amplifier supply voltage, and filtering the power amplifier supply voltage using a controllable filter of the power amplifier module.

In various embodiments, the method further includes providing an adjustable amount of envelope tracking noise filtering using the controllable filter.

In several embodiments, filtering the power amplifier supply voltage using the controllable filter includes selecting one or more circuit branches of a plurality of circuit branches. According to a number of embodiments, each of the circuit branches includes a switch for selecting the circuit branch. In accordance with some embodiments, the plurality of circuit branches includes a plurality of series inductor-capacitor networks. According to various embodiments, the plurality of circuit branches includes a plurality of series resistor-inductor-capacitor networks. In accordance with a number of embodiments, the plurality of circuit branches includes a plurality of series resistor-capacitor networks.

In some embodiments, the method further includes changing an amount of filtering provided by the controllable filter based on a signal characteristic of the radio frequency signal. According to a number of embodiments, the signal characteristic is bandwidth. In accordance with various embodiments, the signal characteristic is a waveform type.

In several embodiments, an amount of filtering provided by the controllable filter changes based on a number of resource blocks allocated to the radio frequency signal.

In various embodiments, the method further includes programming a setting of the controllable filter using an interface of the power amplifier module.

In some embodiments, generating the power amplifier supply voltage includes outputting a plurality of regulated voltages from a DC-to-DC converter, generating a modulator output voltage based on the plurality of regulated voltages and the envelope of the radio frequency signal using a modulator, and filtering the modulator output voltage to generate the power amplifier supply voltage using a modulator output filter. According to a number of embodiments, the method further includes controlling a filtering characteristic of the modulator output filter to provide multiple layers of controllable filtering for the power amplifier supply voltage.

In several embodiments, generating the power amplifier supply voltage includes tracking the envelope using a DC-to-DC converter and an error amplifier operating in parallel.

In certain embodiments, the present disclosure relates to a mobile device. The mobile device includes a transceiver configured to generate a radio frequency signal, a power management system including an envelope tracker configured to generate a power amplifier supply voltage that changes in relation to an envelope of the radio frequency signal, and a power amplifier module including a power amplifier configured to amplify the radio frequency signal and to receive power from the power amplifier supply voltage. The power amplifier module further includes a controllable filter configured to filter the power amplifier supply voltage.

In various embodiments, the controllable filter is operable to provide an adjustable amount of envelope tracking noise filtering.

In several embodiments, the controllable filter includes a plurality of circuit branches that are selectable. According to a number of embodiments, each of the circuit branches includes a switch for selecting the circuit branch. In accordance with some embodiments, the plurality of circuit branches includes a plurality of series inductor-capacitor networks. According to various embodiments, the plurality of circuit branches includes a plurality of series resistor-inductor-capacitor networks. In accordance with a number of embodiments, the plurality of circuit branches includes a plurality of series resistor-capacitor networks.

In some embodiments, an amount of filtering provided by the controllable filter changes based on a signal characteristic of the radio frequency signal. According to various embodiments, the signal characteristic is bandwidth. In accordance with a number of embodiments, the signal characteristic is a waveform type.

In several embodiments, an amount of filtering provided by the controllable filter changes based on a number of resource blocks allocated to the radio frequency signal.

In various embodiments, the power amplifier module is configured to receive data over an interface for programming a setting of the controllable filter.

In some embodiments, the envelope tracker includes a DC-to-DC converter configured to output a plurality of regulated voltages, a modulator configured to generate a modulator output voltage at an output based on the plurality of regulated voltages and the envelope of the radio frequency signal, and a modulator output filter coupled between the output of the modulator and the power amplifier supply voltage. According to a number of embodiments, a filtering characteristic of the modulator output filter is controllable. In accordance with several embodiments, each of the plurality of switches is connected between the output of the modulator and a corresponding one of the plurality of regulated voltages.

In various embodiments, the envelope tracker includes a DC-to-DC converter and an error amplifier configured to operate in parallel with one another to generate the power amplifier supply voltage. According to a number of embodiments, the error amplifier is included on the power amplifier module, and the DC-to-DC converter is external to the power amplifier module.

DETAILED DESCRIPTION OF EMBODIMENTS

Figure 1:
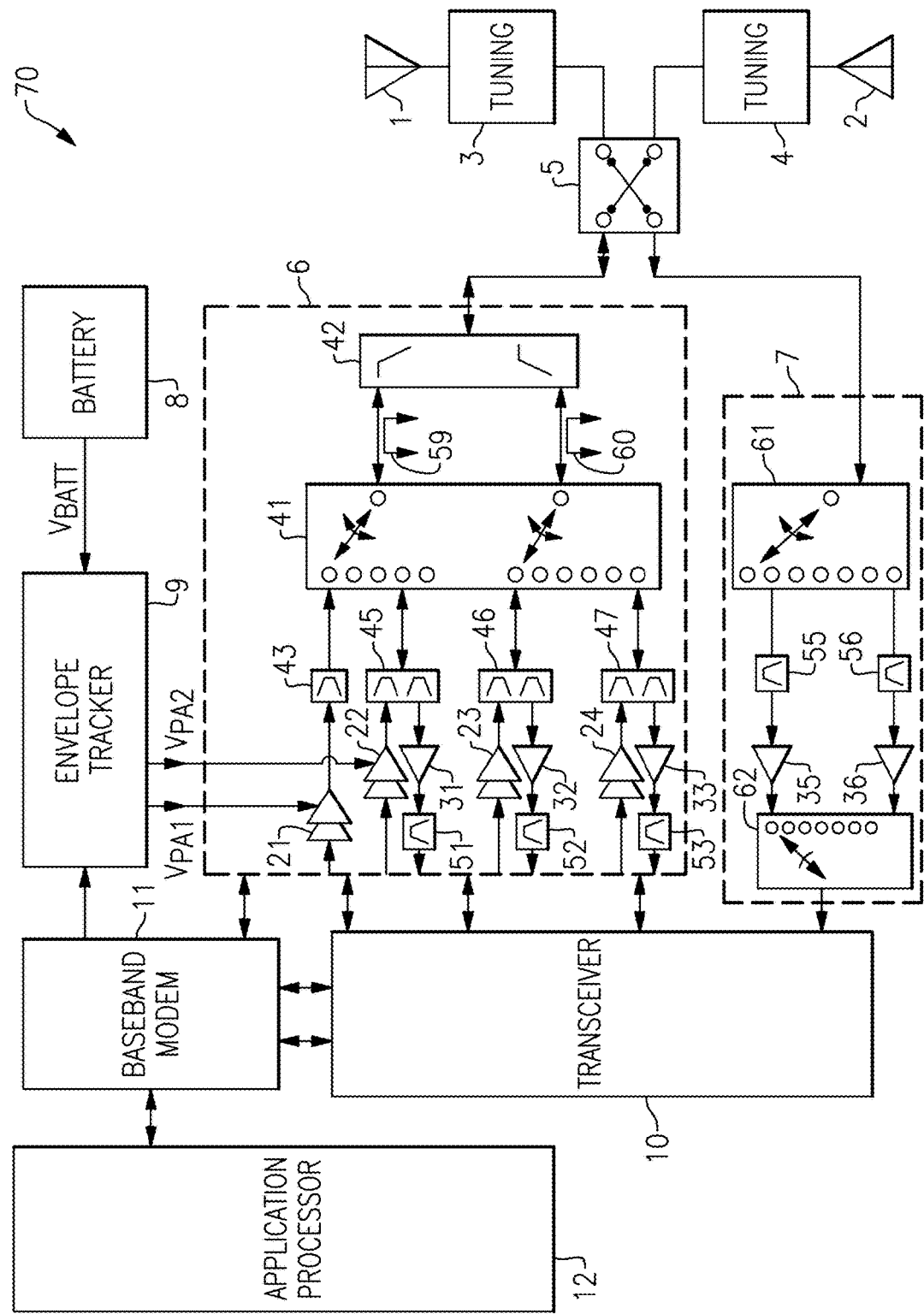
FIG. 1 is a schematic diagram of a mobile device according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Envelope tracking is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

Power amplifier modules with controllable envelope tracking noise filters are provided herein. In certain embodiments, an envelope tracking system includes a power amplifier module and an envelope tracker that provides the power amplifier module with a power amplifier supply voltage that changes based on an envelope of an RF signal amplified by the power amplifier module. The power amplifier module includes a controllable filter that filters the power amplifier supply voltage to provide flexibility in filtering envelope tracking noise.

In certain implementations, the controllable filter includes a bank of selectable circuit branches each including a series combination of a switch, a capacitor, and an inductor. Thus, one or more branches of the series inductor-capacitor (LC) circuits can be selected to achieve a desired amount of noise filtering. Such series LC circuits can serve to snub the power amplifier supply voltage and can be individually selectable by data programmed over an interface, and thus are also referred to herein as programmable LC snubbers.

Although the controllable filter can be implemented as a bank of selectable series LC circuits, other implementations of the controllable filter can be used in accordance with the teachings herein. Other examples of controllable filters include, but are not limited to, selectable series resistor-capacitor (RC) networks and selectable series resistor-inductor-capacitor (RLC) networks.

In certain implementations, the setting of the controllable filter changes over time based on the bandwidth of the RF signal amplified by the power amplifier module. For example, the setting of the controllable filter can be programmed over a serial interface, and changed or adapted as a number of resource blocks (RBs) allocated to the RF signal changes over time. Accordingly, in certain implementations, the amount of filtering provided by the controllable filter is dynamically modified as signal characteristics of the RF signal, such as bandwidth and/or type of waveform, vary over time.

The envelope tracker can be implemented in a wide variety of ways. In a first example, the envelope tracker includes a multi-level supply (MLS) DC-to-DC converter that outputs multiple regulated voltages, an MLS modulator that controls selection of the regulated voltages over time based on the envelope signal, and a modulator output filter coupled between an output of the MLS modulator and the power amplifier supply voltage. In a second example, the envelope tracker includes an error amplifier and a DC-to-DC converter that operate in parallel with one another to generate the power amplifier supply voltage to track the envelope signal. Envelope tracking using a combination of a DC-to-DC converter and an error amplifier is also referred to herein as analog envelope tracking.

In certain implementations, the envelope tracker also includes one or more controllable filters. For instance, the modulator output filter of an MLS envelope tracker and/or a DC-to-DC converter output filter in an analog envelope tracker can also be controllable. In such implementations, multiple layers of controllable filtering are provided, thereby enhancing flexibility and performance.

The envelope tracker can be implemented at least in part external to the power amplifier module. In a first example, the envelope tracker is implemented on a separate envelope tracking module. In a second example, a portion of the envelope tracker (for instance, the error amplifier of an analog envelope tracker) is included on the power amplifier module while another portion of the envelope tracker (for instance, a DC-to-DC converter and a DC-to-DC converter output filter) is external to the power amplifier module.

FIG. 1 is a schematic diagram of a mobile device 70 according to one embodiment. The mobile device 70 includes a primary antenna 1, a diversity antenna 2, a primary antenna tuning circuit 3, a diversity antenna tuning circuit 4, a double-pole double-throw (DPDT) antenna diversity switch 5, a primary front end module 6, a diversity front end module 7, a battery 8, an envelope tracker 9, a transceiver 10, a baseband modem 11, and an application processor 12.

Although one embodiment of a mobile device is shown, the teachings herein are applicable to mobile devices implemented in a wide variety of ways. Accordingly, other implementations are possible.

In the illustrated embodiment, the primary front end module 6 includes a first power amplifier 21, a second power amplifier 22, a third power amplifier 23, a fourth power amplifier 24, a first low noise amplifier 31, a second low noise amplifier 32, a third low noise amplifier 33, a diplexer 42, a transmit/receive band switch 41, a transmit filter 43, a first duplexer 45, a second duplexer 46, a third duplexer 47, a first receive filter 51, a second receive filter 52, a third receive filter 53, a first directional coupler 59, and a second directional coupler 60. Additionally, the diversity front end module 7 includes a first low noise amplifier 35, a second low noise amplifier 36, a first receive filter 55, a second receive filter 56, a first receive band selection switch 61, and a second receive band selection switch 62.

Although one embodiment of front end circuitry is shown, other implementations of front end circuitry are possible. For instance, front end circuitry can include power amplifiers (PAs), low noise amplifiers (LNAs), filters, switches, phase shifters, duplexers, and/or other suitable circuitry for processing RF signals transmitted and/or received from one or more antennas. Example functionalities of a front end include but are not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Accordingly, other implementations of primary front end modules, diversity receive front end modules, antenna selection, and/or antenna tuning can be used.

As shown in FIG. 1, the envelope tracker 9 is used to generate one or more power amplifier supply voltages for power amplifiers used in the mobile device 70 to amplify RF signals for wireless transmission. In the illustrated embodiment, the envelope tracker 9 receives a battery voltage $V_{BATT}$ from the battery 8, and generates a first power amplifier supply voltage $V_{PA1}$ for the first power amplifier 21 and a second power amplifier supply voltage $V_{PA2}$ for the second power amplifier 22. Although an example in which the envelope tracker 9 generates two power amplifier supply voltages is shown, the envelope tracker 9 can generate more or fewer power amplifier supply voltages.

Any of the power amplifiers depicted in FIG. 1 can be implemented with a controllable filter for filtering the supply voltage provided to the power amplifier in accordance with the teachings herein. Thus, the primary front end module 6 can include one or more controllable filters, each of which can be implemented in accordance with any of the embodiments herein.

In one embodiment, the first power amplifier 21 and the second power amplifier 22 each include a controllable filter, and operate in the mobile device 70 to provide uplink carrier aggregation (CA). Thus, the teachings herein are also applicable to envelope noise filtering for CA scenarios.

The envelope tracker 9 controls the first power amplifier supply voltage $V_{PA1}$ to track an envelope of a first RF signal amplified by the first power amplifier 21. Additionally, the envelope tracker 9 controls the second power amplifier supply voltage $V_{PA2}$ to track an envelope of a second RF signal amplified by the second power amplifier 22. In certain implementations, the envelope tracker 9 receives digital envelope data from the baseband modem 11. For example, the envelope tracker 9 can receive a first digital envelope signal indicating an envelope of the first RF signal and a second digital envelope signal indicating an envelope of the second RF signal.

The battery 8 can be any suitable battery for use in the mobile device 70, including, for example, a lithium-ion battery. The battery voltage $V_{BATT}$ is regulated by a DC-to-DC converter of the envelope tracker 9 to generate regulated voltage(s) used for envelope tracking, for instance, analog envelope tracking or MLS envelope tracking.

The transceiver 10 generates RF signals for transmission and processes incoming RF signals received from the primary antenna 1 and the diversity antenna 2. It will be understood that various functionalities associated with the transmission and receiving of RF signals can be achieved by one or more components that are collectively represented in FIG. 1 as the transceiver 10. In one example, separate components (for instance, separate circuits or dies) can be provided for handling certain types of RF signals.

The baseband modem 11 provides the transceiver 10 with digital representations of transmit signals, which the transceiver 10 processes to generate RF signals for transmission. The baseband modem 11 also processes digital representations of received signals provided by the transceiver 10.

As shown in FIG. 1, the baseband modem 11 is coupled to the application processor 12, which serves to provide primary application processing in the mobile device 70. The application processor 12 can provide a wide variety of functions, such as providing system capabilities suitable for supporting applications, including, but not limited to, memory management, graphics processing, and/or multimedia decoding.

Although the mobile device 70 illustrates one example of an RF system, a wide variety of RF systems can include one or more power amplifier modules controlled by an envelope tracker and having a controllable envelope tracking noise filter implemented in accordance with the teaching herein.

Figure 2A:
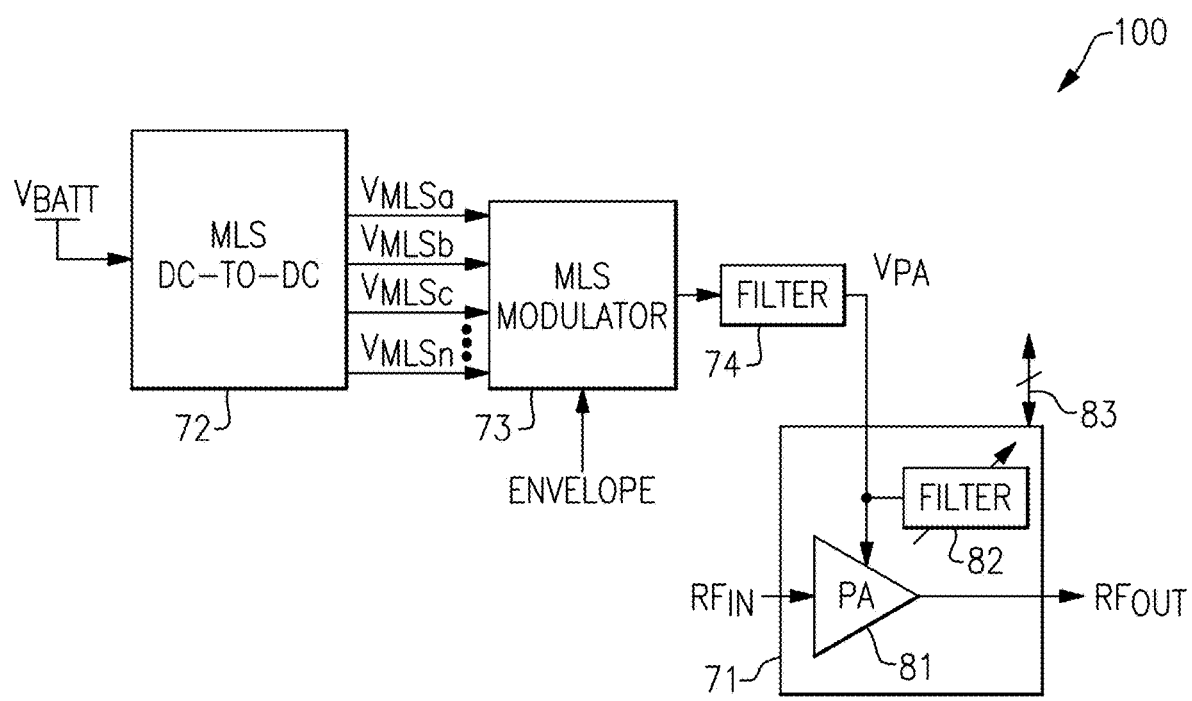
FIG. 2A is a schematic diagram of an envelope tracking system according to one embodiment.

FIG. 2A is a schematic diagram of an envelope tracking system 100. The envelope tracking system 100 includes a power amplifier module 71, an MLS DC-to-DC converter 72, an MLS modulator 73, and a modulator output filter 74. The MLS DC-to-DC converter 72 is also referred to herein as an MLS switching regulator. The power amplifier module 71 includes a power amplifier 81 and a controllable filter 82.

The power amplifier 81 amplifies an RF input signal $RF_{IN}$ to generate an RF output signal $RF_{OUT}$. The MLS modulator 73 receives an envelope signal (ENVELOPE), which changes in relation to an envelope of the RF input signal $RF_{IN}$.

In the illustrated embodiment, the MLS DC-to-DC converter 72 receives a battery voltage $V_{BATT}$, and provides DC-to-DC conversion to generate a variety of regulated voltages $V_{MLSa}$, $V_{MLSb}$, $V_{MLSc}$ ... $V_{MLSn}$ of different voltage levels. Although an example in which four MLS regulated voltages is depicted, the MLS DC-to-DC converter 72 can generate more or fewer MLS regulated voltages as indicated by the ellipses.

The MLS modulator 73 receives the regulated voltages $V_{MLSa}$, $V_{MLSb}$, $V_{MLSc}$ ... $V_{MLSn}$ and the envelope signal, and provides a modulator output voltage to the modulator output filter 74. In certain implementations, the MLS modulator 73 controls the outputted voltage based on selecting a suitable regulated voltage over time based on the envelope signal. For example, the MLS modulator 73 can include a bank of switches for selectively connecting one of the regulated voltages $V_{MLSa}$, $V_{MLSb}$, $V_{MLSc}$ ... $V_{MLSn}$ to the modulator's output based on a signal level of the envelope signal.

In certain implementations, the MLS modulator 73 generates the modulator output voltage based on comparing the envelope signal to two or more signal thresholds. For example, the MLS modulator 73 can include two or more comparators that compare the envelope signal to different signal thresholds. Additionally, the MLS modulator 73 can include a plurality of switches each connected between the output of the MLS modulator 73 and a corresponding one of the regulated voltages, and the switches can be individually activated based on the comparisons.

As shown in FIG. 2A, the power amplifier module 71 includes a controllable filter 82 that filters the power amplifier supply voltage $V_{PA}$ to provide flexibility in filtering envelope tracking noise. In certain implementations, the controllable filter 82 includes a bank of selectable circuit branches. For example, such circuit branches can include a switch in series with one or more resistor, capacitor, and/or inductor circuit elements. Thus, one or more circuit branches can be selected to achieve a desired amount of noise filtering.

The controllable filter 82 can be controlled in a variety of ways. In certain implementations, the power amplifier module 71 includes an interface 83 that receives data for selecting the setting of the controllable filter 82.

In certain implementations, the setting of the controllable filter 82 changes over time based on the bandwidth of the RF signal $RF_{IN}$. For example, the setting of the controllable filter 82 can be changed based on a number of RBs allocated to the RF signal $RF_{IN}$.

Figure 2B:
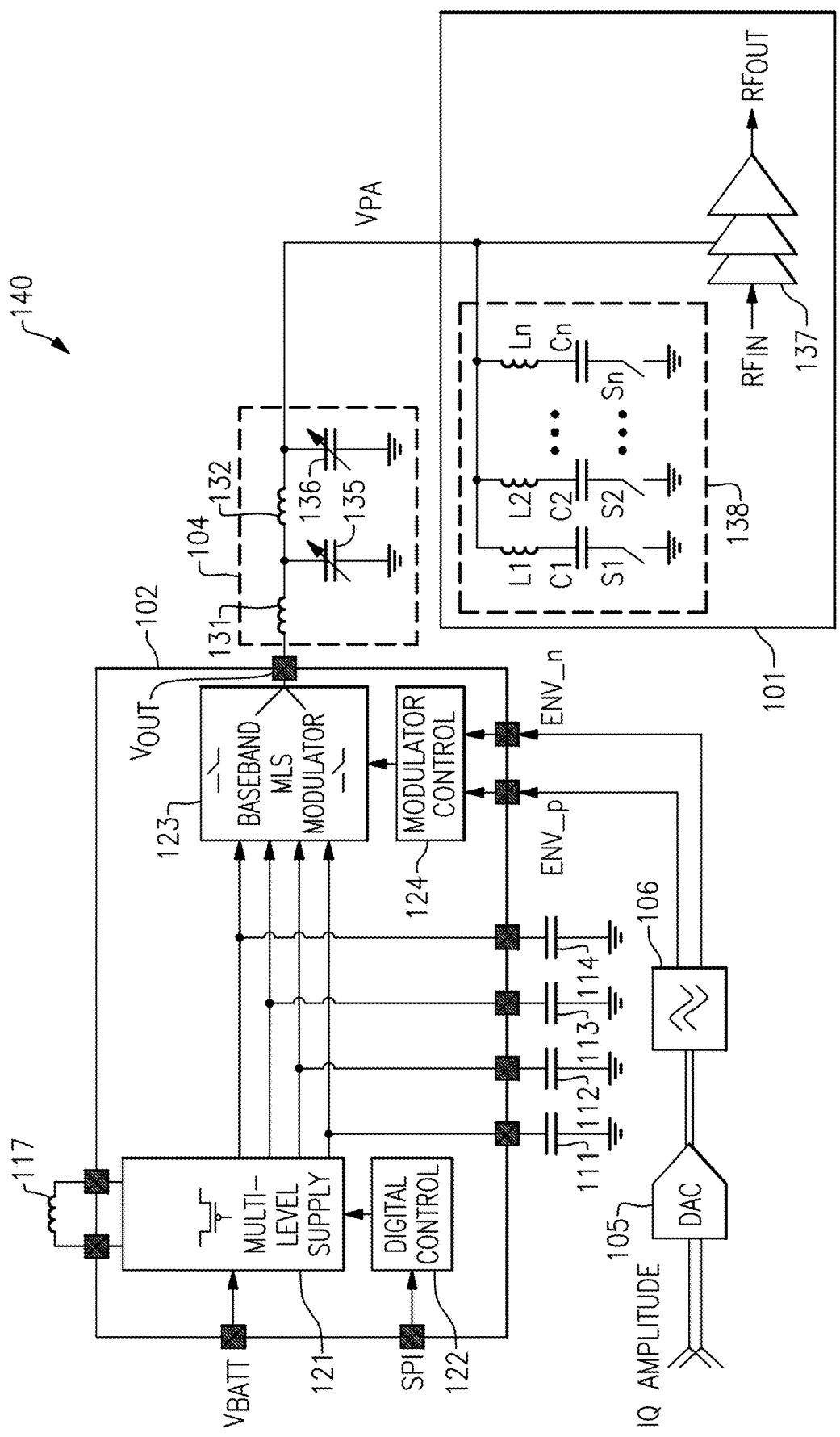
FIG. 2B is a schematic diagram of an envelope tracking system according to another embodiment.

FIG. 2B is a schematic diagram of another embodiment of an envelope tracking system 140. The envelope tracking system 140 includes a power amplifier module 101, an envelope tracking integrated circuit (IC) 102, a modulator output filter 104 (which is controllable, in this embodiment), DAC circuitry 105, an envelope filter 106, a first decoupling capacitor 111, a second decoupling capacitor 112, a third decoupling capacitor 113, a fourth decoupling capacitor 114, and an inductor 117.

Although one embodiment of an envelope tracking system is shown in FIG. 2B, the teachings herein are applicable to envelope tracking systems implemented in a wide variety of ways. Accordingly, other implementations are possible.

In the illustrated embodiment, the envelope tracking IC 102 includes MLS switching circuitry 121, a digital control circuit 122, a baseband MLS modulator 123, and a modulator control circuit 124. The envelope tracking IC 102 of FIG. 2B is depicted with various pins or pads for providing a variety of functions, such as receiving a battery voltage ($V_{BATT}$), communicating over a serial peripheral interface (SPI), outputting an output voltage $V_{OUT}$, receiving a differential analog envelope signal (ENV_p, ENV_n), connecting to the decoupling capacitors 111-114, and connecting to the inductor 117. An envelope tracking IC is also referred to herein in as an envelope tracking semiconductor die or chip.

The MLS switching circuitry 121 controls a current through the inductor 117 to provide voltage regulation. For example, the MLS switching circuitry 121 can include switches and a controller that turns on and off the switches using any suitable regulation scheme (including, but not limited to, pulse-width modulation or PWM) to provide DC-to-DC conversion. In the illustrated embodiment, the MLS switching circuitry 121 outputs four regulated MLS voltages of different voltage levels. However, the MLS switching circuitry 121 can be implemented to output more or fewer regulated voltages.

As shown in FIG. 2B, the MLS switching circuitry 121 is controlled by the digital control circuit 122. The digital control circuit 122 can provide programmability to the MLS switching circuitry 121 including, but not limited to, control over voltage levels of one or more regulated voltages outputted by the MLS switching circuitry 121. As shown in FIG. 2B, the digital control circuit 122 is coupled to the SPI bus. In certain implementations, the digital control circuit 122 controls the MLS switching circuitry 121 based on data received over the SPI bus and/or other chip interface.

The baseband MLS modulator 123 includes an output coupled to the power amplifier supply voltage $V_{PA}$ through the modulator output filter 104. The output of the baseband MLS modulator 123 provides an output voltage $V_{OUT}$. In certain implementations, the baseband MLS modulator 123 includes switches coupled between each of the regulated MLS voltages and the modulator output filter 104. Additionally, the modulator's switches are selectively opened or closed by the modulator control circuit 124 based on the envelope signal.

In certain implementations, the modulator control circuit 124 includes a differential envelope amplifier for converting the differential analog envelope signal into a single-ended envelope signal, and two or more comparators that compare the single-ended analog envelope signal to different signal thresholds. Additionally, the modulator control circuit 124 controls the activation of the switches of the MLS modulator 123 based on the results of the comparisons.

In the illustrated embodiment, the modulator output filter 104 includes a first series inductor 131, a second series inductor 132, a first shunt capacitor 135, and a second shunt capacitor 136. In this example, the first shunt capacitor 135 and the second shunt capacitor 136 are controllable. Although two examples of controllable filter components are shown, other filter components of an envelope tracker can additionally or alternatively be implemented to be controllable.

As shown in FIG. 2B, the power amplifier module 101 includes a power amplifier 137 and a controllable filter 138. The power amplifier 137 amplifies an RF input signal $RF_{IN}$ to generate an RF output signal $RF_{OUT}$. Additionally, the controllable filter 138 inductors L1, L2, . . . Ln, capacitors C1, C2, . . . Cn, and switches S1, S2, . . . Sn implemented as selectable branches of LC networks, in the embodiment. Thus, the controllable filter 138 includes n branches, where n is any desired number of selectable branches. In a first example, n is greater than or equal to 2. In a second example, n is greater than or equal to 4.

In the illustrated embodiment, multiple levels or layers of filter controllability are provided including flexibility to provide envelope tracking noise filtering on the power amplifier module 101 and thus local to the power amplifier 137.

Figure 3:
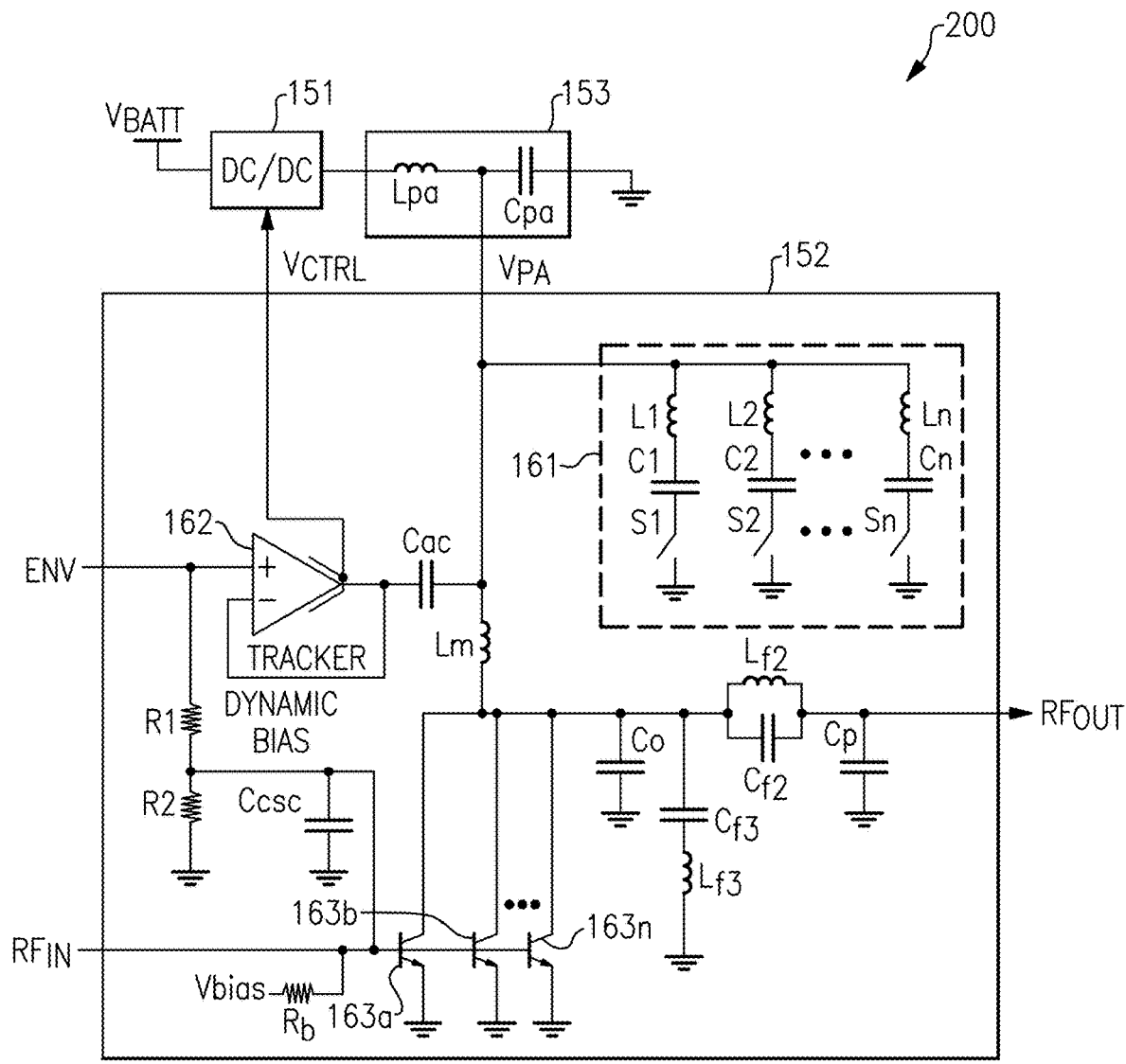
FIG. 3 is a schematic diagram of an envelope tracking system according to another embodiment.

FIG. 3 is a schematic diagram of an envelope tracking system 200 according to another embodiment. The envelope tracking system 200 includes a DC-to-DC converter (DC/DC) 151, a power amplifier module 152, and a converter output circuit 153.

As shown in FIG. 3, the power amplifier module 152 includes a controllable filter 161, power amplifier bipolar transistors 163a, 163b, . . . 163n, a bias resistor $R_b$, a first dynamic bias resistor R1, a second dynamic bias resistor R2, a shunt capacitor Ccsc, a choke inductor Lm, and an output matching network including a first shunt capacitor Co, a second shunt capacitor Cp, a second harmonic capacitor $C_{f2}$, a second harmonic inductor $L_{f2}$, a third harmonic capacitor $C_{f3}$, and a third harmonic inductor $L_{F3}$. Although one embodiment of power amplifier circuitry is depicted, the teachings herein are applicable to power amplifier circuitry implemented in a wide variety of ways.

A portion of an envelope tracker has also been formed on the power amplifier module 152, in this embodiment. In particular, an error amplifier 162 and an AC coupling capacitor Cac of the envelope tracker are formed on the power amplifier module 152. The envelope tracker also includes another portion external to the power amplifier module 152, and that includes the DC-to-DC converter 151 and the converter output circuit 153.

As shown in FIG. 3, the converter output circuit 153 includes a shunt capacitor Cpa to ground and an inductor Lpa in series between an output of the DC-to-DC converter 151 and the power amplifier supply voltage $V_{PA}$ provided to the power amplifier module 152. Although not depicted in FIG. 3, in certain implementations one or more components of the converter output circuit 153 are controllable. In one example, the shunt capacitor Cpa is implemented as a bank of selectable capacitors.

The controllable filter 161 provides controllable filtering to the power amplifier supply voltage $V_{PA}$. In the illustrated embodiment, the controllable filter 161 includes inductors L1, L2, . . . Ln, capacitors C1, C2, . . . Cn, and switches S1, S2, . . . Sn implemented as selectable branches of LC networks.

With continuing reference to FIG. 3, the bases of the power amplifier bipolar transistors 163a, 163b, . . . 163n receive the RF input signal $RF_{IN}$ and a bias voltage Vbias provided through the bias resistor $R_b$. Furthermore, a dynamic bias that tracks the envelope signal ENV is provided to the bases of the power amplifier bipolar transistors 163a, 163b, . . . 163n by way of a voltage divider formed from the first dynamic bias resistor R1 and the second dynamic bias resistor R2.

The collectors of the power amplifier bipolar transistors 163a, 163b, . . . 163n receive the power amplifier supply voltage $V_{PA}$ from the choke inductor Lm, and provide the RF output signal $RF_{OUT}$ to the output of the power amplifier module 152 by way of the output matching network.

As shown in FIG. 3, the error amplifier 162 is connected with negative feedback, and adjusts the power amplifier supply voltage $V_{PA}$ based on the envelope signal ENV by injecting an error current through the AC coupling capacitor Cac. The error amplifier 162 also provides a control voltage $V_{CTRL}$ to the DC-to-DC converter 151. In certain implementations, the control voltage $V_{CTRL}$ tracks the error amplifier's error current. The DC-to-DC converter 151 is powered by a battery voltage $V_{BATT}$, and outputs a regulated voltage having a voltage level that is controlled by the control voltage $V_{CTRL}$.

Figure 4:
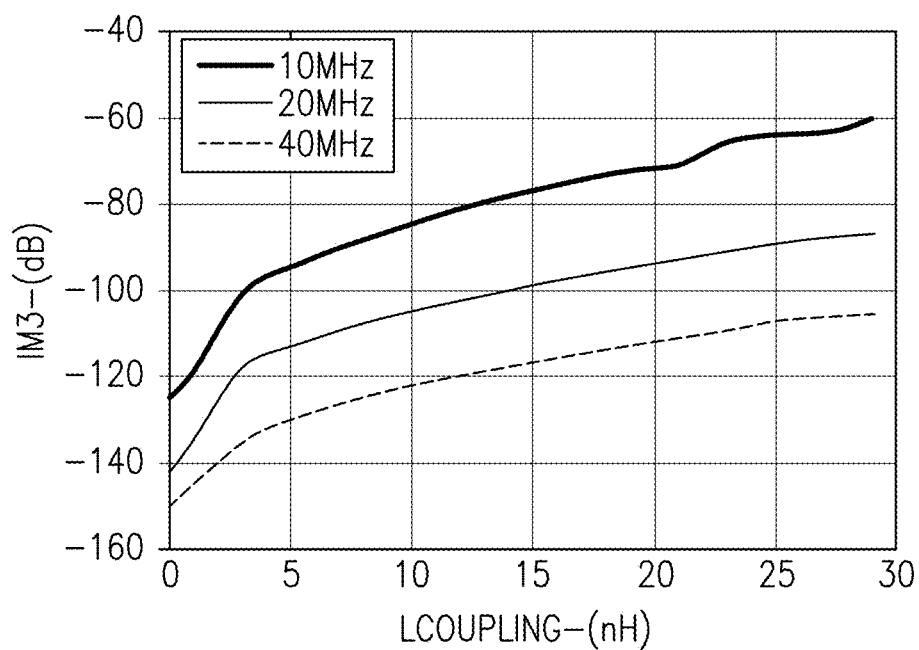
FIG. 4 is a graph of one example of third-order intermodulation distortion (IM3) versus filter inductance.

FIG. 4 is a graph of one example of third-order intermodulation distortion (IM3) versus filter inductance. As shown in FIG. 4, changing the inductance of an envelope tracking noise filter changes IM3, and thus provides a mechanism for transmit noise reduction. IM3 is depicted in three plots corresponding to bandwidths of 10 MHz, 20 MHz, and 40 MHz.

Figure 5A:
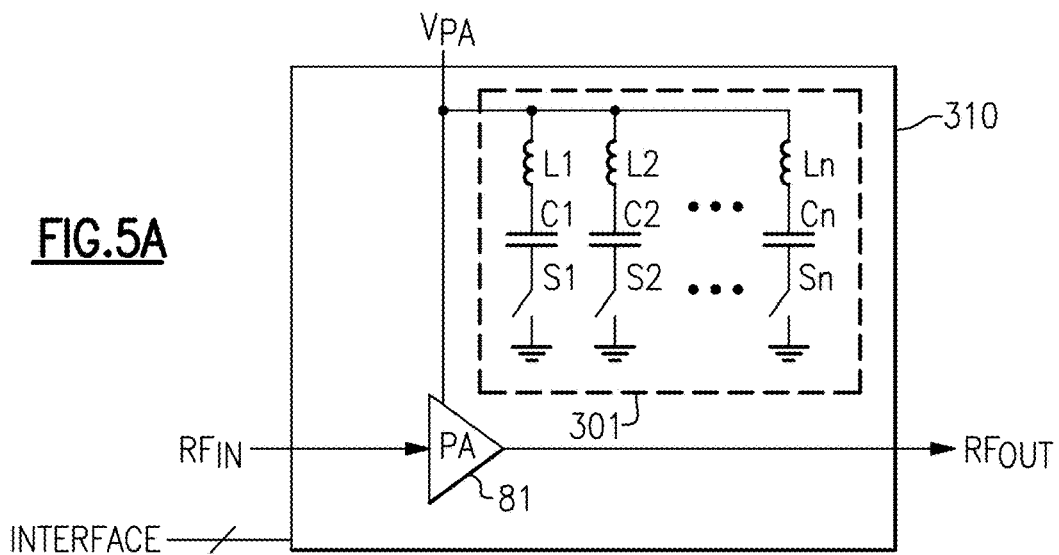
FIG. 5A is a schematic diagram of a power amplifier module according to another embodiment.

FIG. 5A is a schematic diagram of a power amplifier module 310 according to another embodiment. The power amplifier module 310 includes a power amplifier 81 that amplifies an RF input signal $RF_{IN}$ to generate an RF output signal $RF_{OUT}$. The power amplifier 81 receives power from a power amplifier supply voltage $V_{PA}$. The power amplifier module 310 further includes a controllable filter 301 for filtering the power amplifier supply voltage $V_{PA}$, and an interface for controlling a variety of parameters of the power amplifier module 310 including a setting of the controllable filter 301.

In the illustrated embodiment, the controllable filter 301 includes inductors L1, L2, ... Ln, capacitors C1, C2, ... Cn, and switches S1, S2, ... Sn implemented as selectable branches of LC networks. For example, the interface can receive digital data indicating which of the switches S1, S2, ... Sn are opened and which are closed.

Figure 5B:
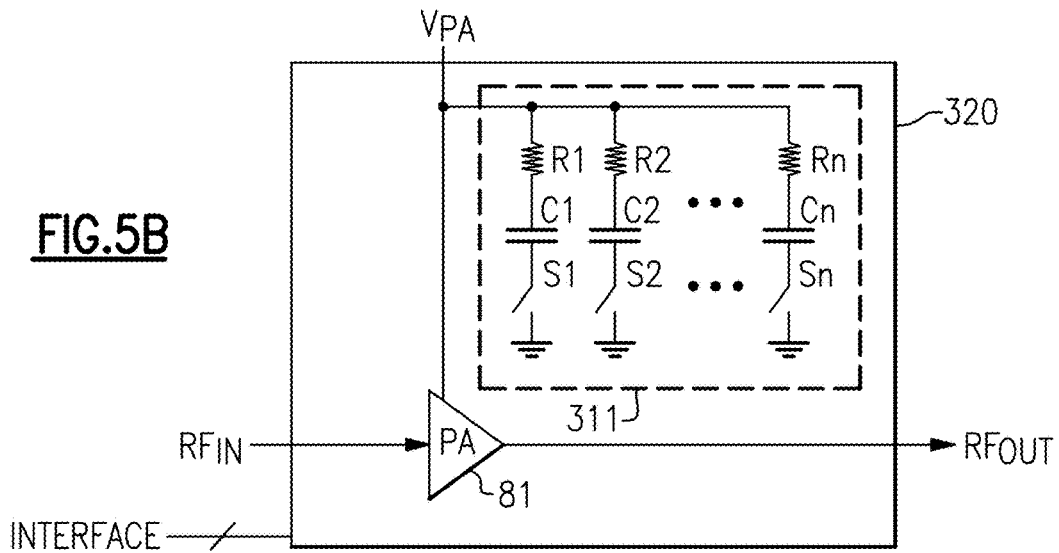
FIG. 5B is a schematic diagram of a power amplifier module according to another embodiment.

FIG. 5B is a schematic diagram of a power amplifier module 320 according to another embodiment. The power amplifier module 320 includes a power amplifier 81 and a controllable filter 311 controlled by an interface.

The power amplifier module 320 of FIG. 5B is similar to the power amplifier module 310 of FIG. 5A, except that the power amplifier module 320 includes a different implementation of a controllable filter. In particular, the controllable filter 311 of FIG. 5B includes resistors R1, R2, ... Rn, capacitors C1, C2, ... Cn, and switches S1, S2, ... Sn implemented as selectable branches of RC networks.

Figure 5C:
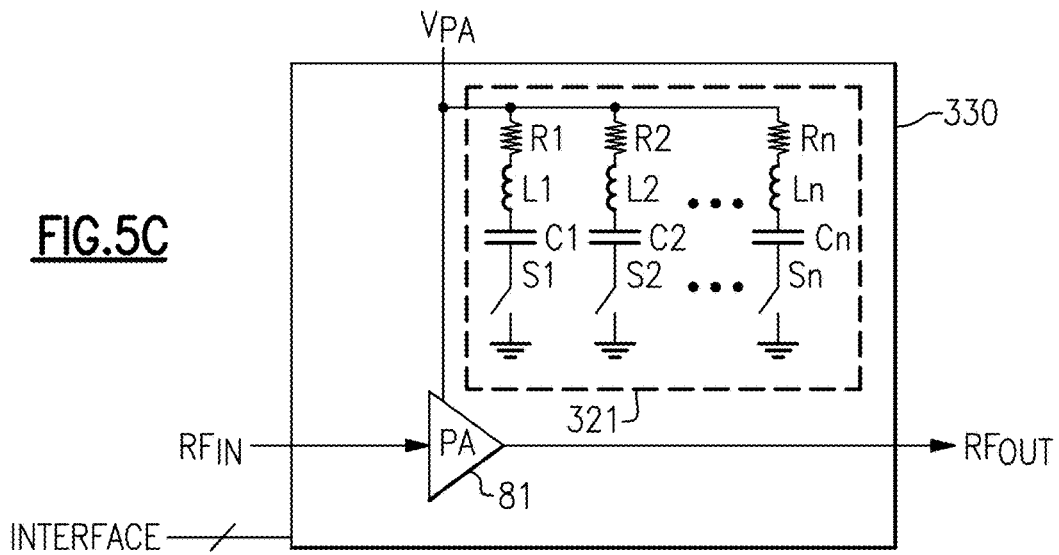
FIG. 5C is a schematic diagram of a power amplifier module according to another embodiment.

FIG. 5C is a schematic diagram of a power amplifier module 330 according to another embodiment. The power amplifier module 330 includes a power amplifier 81 and a controllable filter 321 controlled by an interface.

The power amplifier module 330 of FIG. 5C is similar to the power amplifier module 310 of FIG. 5A, except that the power amplifier module 330 includes a different implementation of the controllable filter. In particular, the controllable filter 321 of FIG. 5C includes resistors R1, R2, ... Rn, inductors L1, L2, ... Ln, capacitors C1, C2, ... Cn, and switches S1, S2, ... Sn implemented as selectable branches of RLC networks.

Figure 6A:
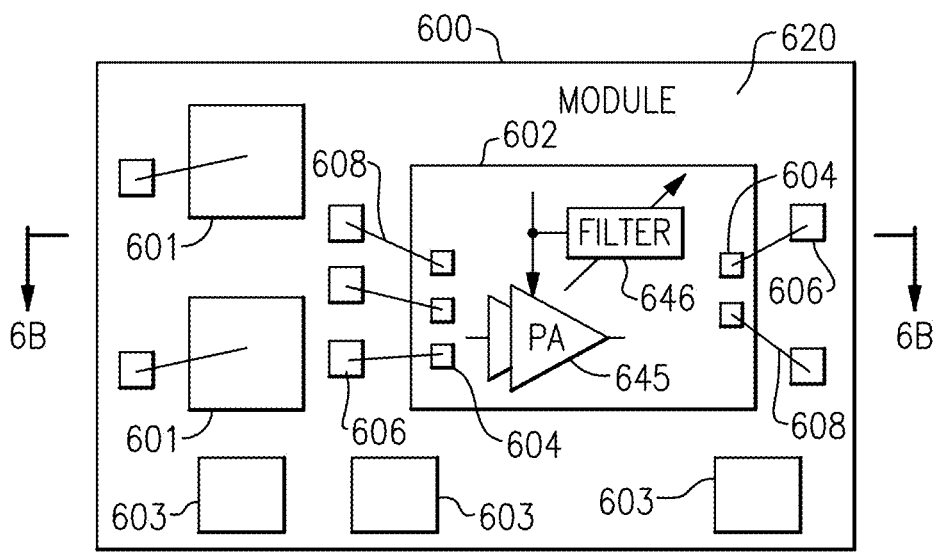
FIG. 6A is a schematic diagram of one embodiment of a packaged module.
Figure 6B:
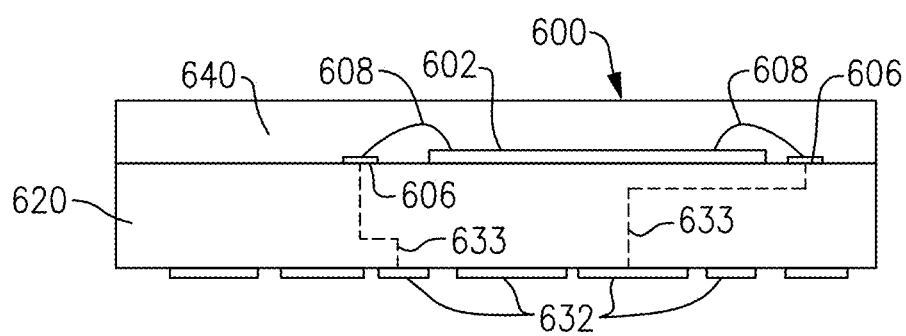
FIG. 6B is a schematic diagram of a cross-section of the packaged module of FIG. 6A taken along the lines 6B-6B.

FIG. 6A is a schematic diagram of one embodiment of a packaged module 600. FIG. 6B is a schematic diagram of a cross-section of the packaged module 600 of FIG. 6A taken along the lines 6B-6B.

The packaged module 600 includes radio frequency components 601, a semiconductor die 602, surface mount devices 603, wirebonds 608, a package substrate 620, and an encapsulation structure 640. The package substrate 620 includes pads 606 formed from conductors disposed therein. Additionally, the semiconductor die 602 includes pins or pads 604, and the wirebonds 608 have been used to connect the pads 604 of the die 602 to the pads 606 of the package substrate 620.

The semiconductor die 602 includes a power amplifier 645 and a controllable filter 646, which can be implemented in accordance with any of the embodiments herein. Although depicted as being formed on the die 602, the controllable filter 646 can also be implemented in all or part using off-chip components and/or can be formed on a separate die from the power amplifier 645. In one example, switches of the controllable filter 646 are formed on the semiconductor die 602, while one or more other components of the controllable filter 646 (for instance, inductors and/or capacitors) are formed using structures external to the semiconductor die 602.

The packaging substrate 620 can be configured to receive a plurality of components such as radio frequency components 601, the semiconductor die 602 and the surface mount devices 603, which can include, for example, surface mount capacitors and/or inductors. In one implementation, the radio frequency components 601 include integrated passive devices (IPDs).

As shown in FIG. 6B, the packaged module 600 is shown to include a plurality of contact pads 632 disposed on the side of the packaged module 600 opposite the side used to mount the semiconductor die 602. Configuring the packaged module 600 in this manner can aid in connecting the packaged module 600 to a circuit board, such as a phone board of a mobile device. The example contact pads 632 can be configured to provide radio frequency signals, bias signals, and/or power (for example, a power supply voltage and ground) to the semiconductor die 602 and/or other components. As shown in FIG. 6B, the electrical connections between the contact pads 632 and the semiconductor die 602 can be facilitated by connections 633 through the package substrate 620. The connections 633 can represent electrical paths formed through the package substrate 620, such as connections associated with vias and conductors of a multilayer laminated package substrate.

In some embodiments, the packaged module 600 can also include one or more packaging structures to, for example, provide protection and/or facilitate handling. Such a packaging structure can include overmold or encapsulation structure 640 formed over the packaging substrate 620 and the components and die(s) disposed thereon.

It will be understood that although the packaged module 600 is described in the context of electrical connections based on wirebonds, one or more features of the present disclosure can also be implemented in other packaging configurations, including, for example, flip-chip configurations.

Figure 7:
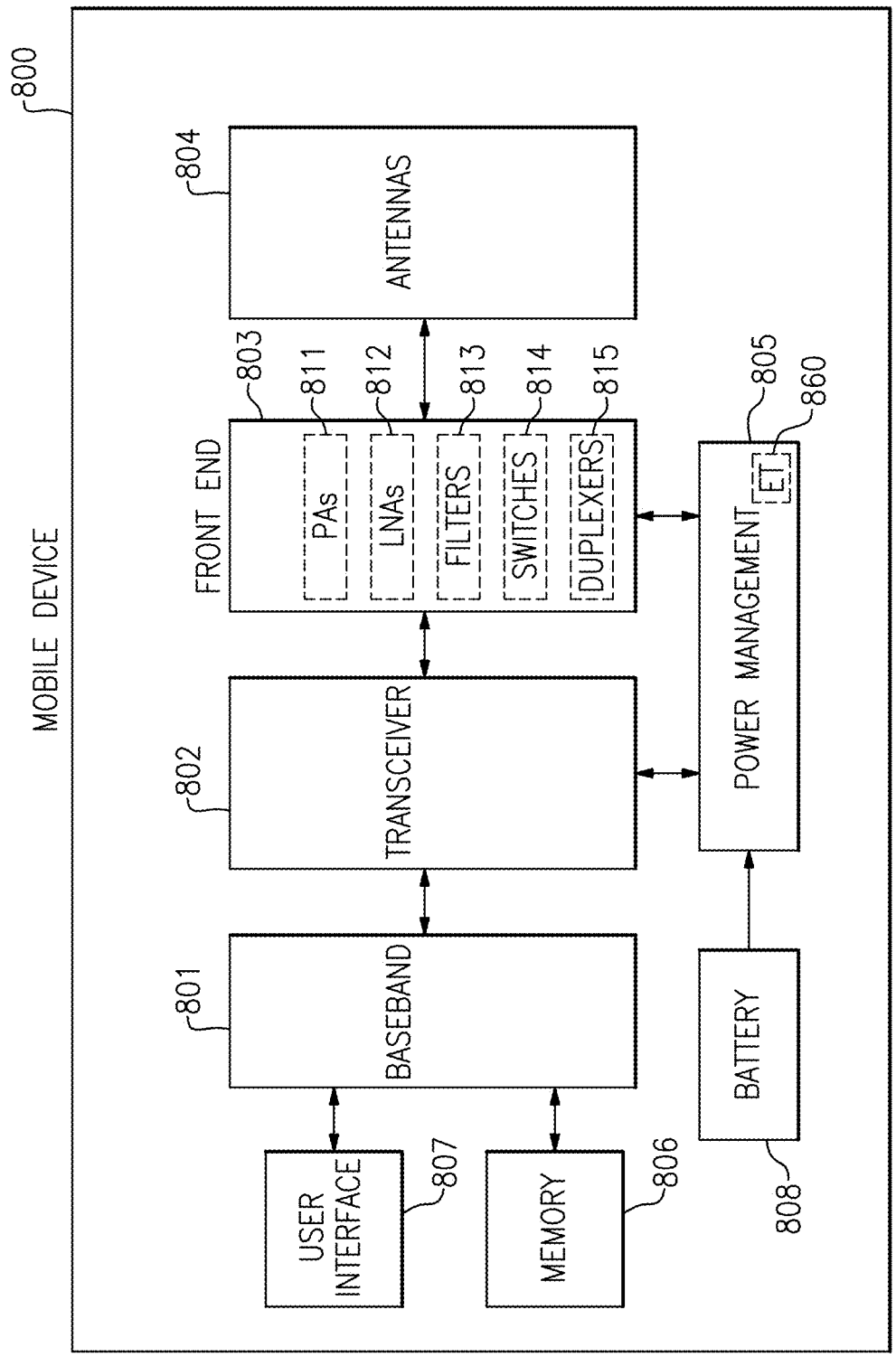
FIG. 7 is a schematic diagram of a mobile device according to another embodiment.

FIG. 7 is a schematic diagram of a mobile device 800 according to another embodiment. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The mobile device 800 can be implemented in accordance with any of the embodiments herein. In certain implementations, the filters 813 include at least one controllable envelope tracking noise filter for filtering the supply voltage of at least one of the power amplifiers 811.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. The power management system 805 can include an MLS envelope tracker 860 implemented in accordance with one or more features of the present disclosure.

As shown in FIG. 7, the power management system 805 receives a battery voltage form the battery 808. The battery 808 can be any suitable battery for use in the mobile device 800, including, for example, a lithium-ion battery.

Figure 8:
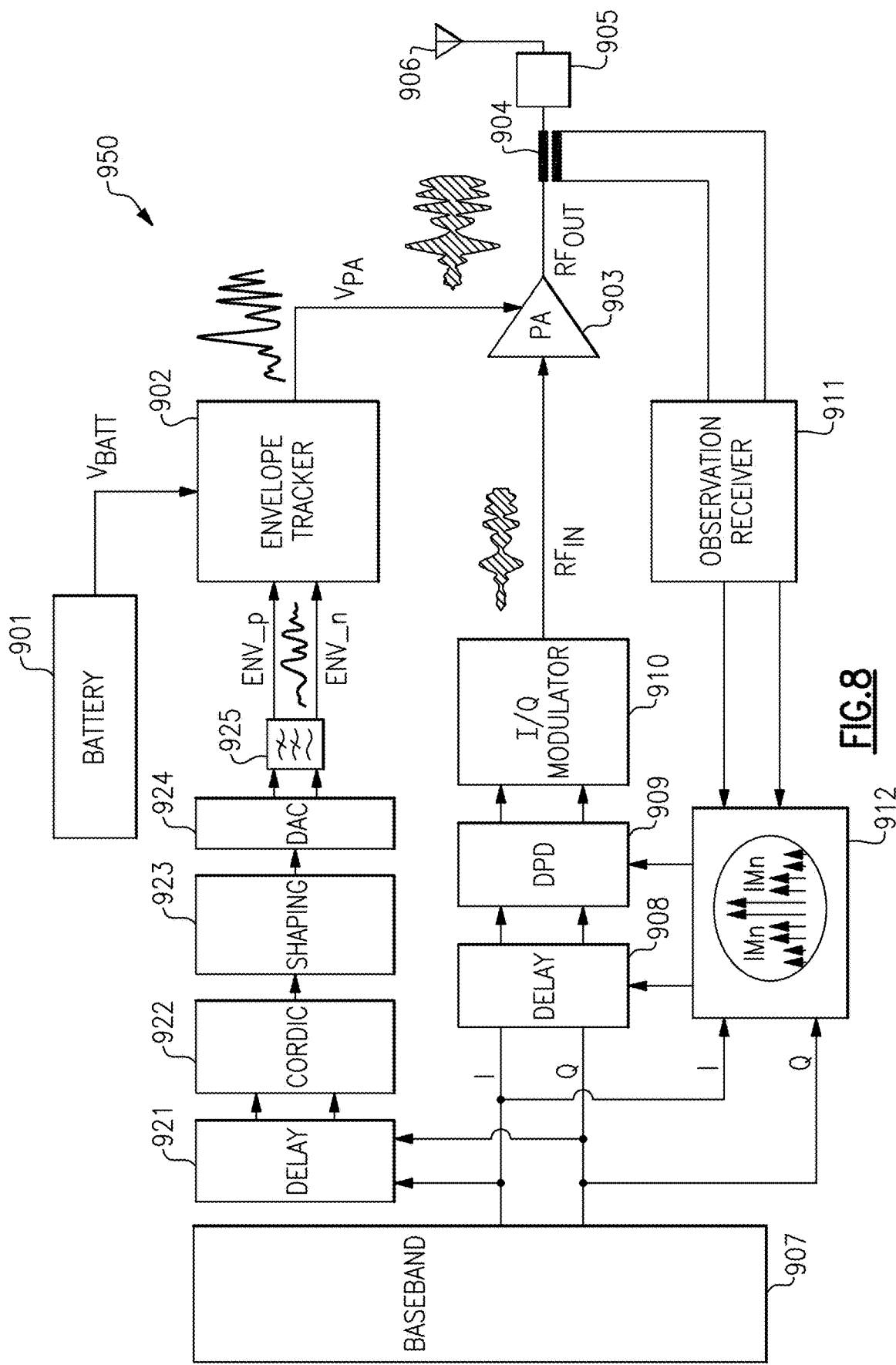
FIG. 8 is a schematic diagram of one embodiment of a communication system for transmitting radio frequency (RF) signals.

FIG. 8 is a schematic diagram of one embodiment of a communication system 950 for transmitting RF signals. The communication system 950 includes a battery 901, an envelope tracker 902, a power amplifier 903, a directional coupler 904, a duplexing and switching circuit 905, an antenna 906, a baseband processor 907, a signal delay circuit 908, a digital pre-distortion (DPD) circuit 909, an I/Q modulator 910, an observation receiver 911, an intermodulation detection circuit 912, an envelope delay circuit 921, a coordinate rotation digital computation (CORDIC) circuit 922, a shaping circuit 923, a digital-to-analog converter 924, and a reconstruction filter 925.

The communication system 950 of FIG. 8 illustrates one example of an RF system that can include an envelope tracking system implemented in accordance with one or more features of the present disclosure. However, the teachings herein are applicable to RF systems implemented in a wide variety of ways.

The baseband processor 907 operates to generate an in-phase (I) signal and a quadrature-phase (Q) signal, which correspond to signal components of a sinusoidal wave or signal of a desired amplitude, frequency, and phase. For example, the I signal and the Q signal provide an equivalent representation of the sinusoidal wave. In certain implementations, the I and Q signals are outputted in a digital format. The baseband processor 907 can be any suitable processor for processing baseband signals. For instance, the baseband processor 907 can include a digital signal processor, a microprocessor, a programmable core, or any combination thereof.

The signal delay circuit 908 provides adjustable delay to the I and Q signals to aid in controlling relative alignment between the differential analog envelope signal ENV_p, ENV_n provided to the envelope tracker 902 and the RF signal $RF_{IN}$ provided to the power amplifier 903. The amount of delay provided by the signal delay circuit 908 is controlled based on amount of intermodulation in adjacent bands detected by the intermodulation detection circuit 912.

The DPD circuit 909 operates to provide digital shaping to the delayed I and Q signals from the signal delay circuit 908 to generate digitally pre-distorted I and Q signals. In the illustrated embodiment, the DPD provided by the DPD circuit 909 is controlled based on amount of intermodulation detected by the intermodulation detection circuit 912. The DPD circuit 909 serves to reduce a distortion of the power amplifier 903 and/or to increase the efficiency of the power amplifier 903.

The I/Q modulator 910 receives the digitally pre-distorted I and Q signals, which are processed to generate the RF signal $RF_{IN}$. For example, the I/Q modulator 910 can include DACs configured to convert the digitally pre-distorted I and Q signals into an analog format, mixers for upconverting the analog I and Q signals to radio frequency, and a signal combiner for combining the upconverted I and Q signals into the RF signal $RF_{IN}$. In certain implementations, the I/Q modulator 910 can include one or more filters configured to filter frequency content of signals processed therein.

The envelope delay circuit 921 delays the I and Q signals from the baseband processor 907. Additionally, the CORDIC circuit 922 processes the delayed I and Q signals to generate a digital envelope signal representing an envelope of the RF signal $RF_{IN}$. Although FIG. 8 illustrates an implementation using the CORDIC circuit 922, an analog envelope signal can be obtained in other ways.

The shaping circuit 923 operates to shape the digital envelope signal to enhance the performance of the communication system 950. In certain implementations, the shaping circuit 923 includes a shaping table that maps each level of the digital envelope signal to a corresponding shaped envelope signal level. Envelope shaping can aid in controlling linearity, distortion, and/or efficiency of the power amplifier 903.

In the illustrated embodiment, the shaped envelope signal is a digital signal that is converted by the DAC 924 to a differential analog envelope signal. Additionally, the differential analog envelope signal is filtered by the reconstruction filter 925 to generate a differential analog envelope signal ENV_p, ENV_n for the envelope tracker 902. However, other implementations are possible.

With continuing reference to FIG. 8, the envelope tracker 902 receives the differential analog envelope signal from the reconstruction filter 925 and a battery voltage $V_{BATT}$ from the battery 901, and uses the differential analog envelope signal ENV_p, ENV_n to generate a power amplifier supply voltage $V_{PA}$ for the power amplifier 903 that changes in relation to the envelope of the RF signal $RF_{IN}$. The power amplifier 903 receives the RF signal $RF_{IN}$ from the I/Q modulator 910, and provides an amplified RF signal $RF_{OUT}$ to the antenna 906 through the duplexing and switching circuit 905, in this example.

The directional coupler 904 is positioned between the output of the power amplifier 903 and the input of the duplexing and switching circuit 905, thereby allowing a measurement of output power of the power amplifier 903 that does not include insertion loss of the duplexing and switching circuit 905. The sensed output signal from the directional coupler 904 is provided to the observation receiver 911, which can include mixers for providing down conversion to generate downconverted I and Q signals, and DACs for generating I and Q observation signals from the downconverted I and Q signals.

The intermodulation detection circuit 912 determines an intermodulation product between the I and Q observation signals and the I and Q signals from the baseband processor 907. Additionally, the intermodulation detection circuit 912 controls the DPD provided by the DPD circuit 909 and/or a delay of the signal delay circuit 908 to control relative alignment between the differential analog envelope signal ENV_p, ENV_n and the RF signal $RF_{IN}$. In another embodiment, the intermodulation detection circuit 912 additionally or alternatively controls a delay of the signal delay circuit 921.

By including a feedback path from the output of the power amplifier 903 and baseband, the I and Q signals can be dynamically adjusted to optimize the operation of the communication system 950. For example, configuring the communication system 950 in this manner can aid in providing power control, compensating for transmitter impairments, and/or in performing DPD.

Although illustrated as a single stage, the power amplifier 903 can include one or more stages. Furthermore, the teachings herein are applicable to communication systems including multiple power amplifiers.

Figure 9:
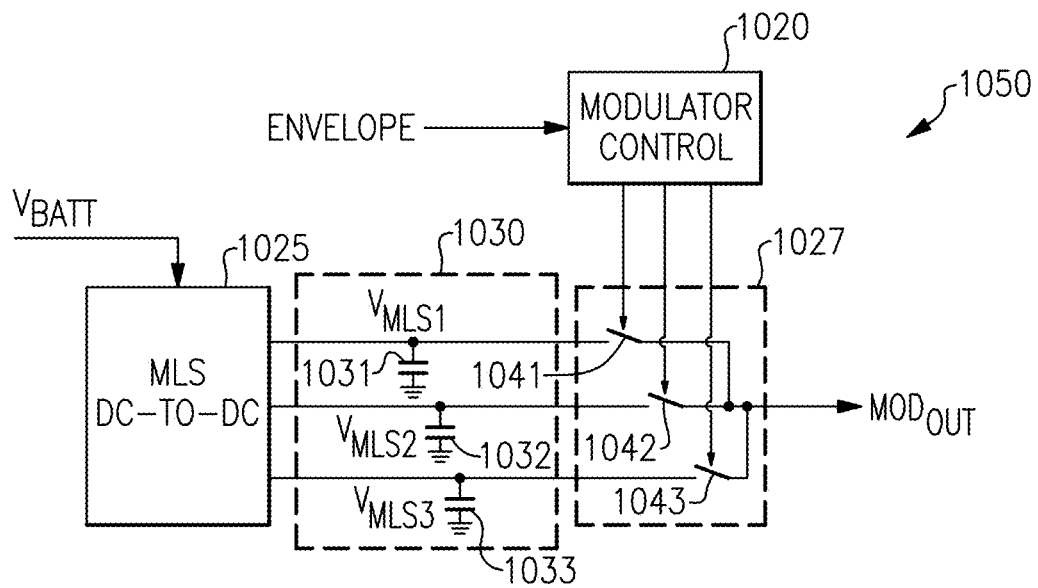
FIG. 9 is a schematic diagram of a multi-level supply (MLS) modulation system according to one embodiment.

FIG. 9 is a schematic diagram of an MLS modulation system 1050 according to one embodiment. The MLS modulation system 1050 includes a modulator control circuit 1020, an MLS DC-to-DC converter 1025, a modulator switch bank 1027, and a decoupling capacitor bank 1030.

The MLS modulation system 1050 of FIG. 9 illustrates one implementation of MLS modulator circuitry suitable for incorporation in a multi-level envelope tracker. However, other implementations of MLS modulator circuitry can be included in multi-level envelope trackers implemented in accordance with the teachings herein.

The MLS DC-to-DC converter 1025 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the MLS DC-to-DC converter 1025 can generate more or fewer regulated voltages. In certain implementations, at least a portion of the regulated voltages are boosted in voltage level relative to the battery voltage $V_{BATT}$. Additionally or alternatively, one or more of the regulated voltages is a buck voltage having a voltage level lower than that of the battery voltage $V_{BATT}$.

The decoupling capacitor bank 1030 aids in stabilizing the regulated voltages generated by the MLS DC-to-DC converter 1025. For example, the decoupling capacitor bank 1030 of FIG. 9 includes a first decoupling capacitor 1031 for decoupling the first regulated voltage $V_{MLS1}$, a second decoupling capacitor 1032 for decoupling the second regulated voltage $V_{MLS2}$, and a third decoupling capacitor 1033 for decoupling the third regulated voltage $V_{MLS3}$.

With continuing reference to FIG. 9, the modulator switch bank 1027 includes a first switch 1041 connected between the modulator's output ($MOD_{OUT}$) and the first regulated voltage $V_{MLS1}$, a second switch 1042 connected between the modulator's output and the second regulated voltage $V_{MLS2}$, and a third switch 1043 connected between the modulator's output and the third regulated voltage $V_{MLS3}$. The modulator control 1020 operates to selectively open or close the switches 1041-1043 to thereby control modulator's output based on an envelope signal ENVELOPE.

Figure 10:
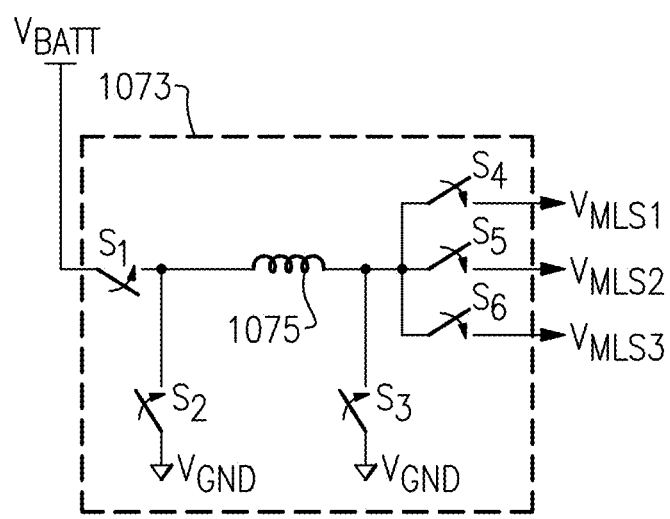
FIG. 10 is a schematic diagram of an MLS DC-to-DC converter according to one embodiment.

FIG. 10 is a schematic diagram of an MLS DC-to-DC converter 1073 according to one embodiment. The MLS DC-to-DC converter 1073 includes an inductor 1075, a first switch $S_1$, a second switch $S_2$, a third switch $S_3$, a fourth switch $S_4$, a fifth switch $S_5$, and a sixth switch $S_6$. The MLS DC-to-DC converter 1073 further includes control circuitry (not shown in FIG. 10) for opening and closing the switches to provide regulation.

The MLS DC-to-DC converter 1073 of FIG. 10 illustrates one implementation of an MLS DC-to-DC converter suitable for incorporation in a multi-level envelope tracker. However, other implementations of MLS DC-to-DC converters can be included in multi-level envelope trackers implemented in accordance with the teachings herein.

In the illustrated embodiment, the first switch $S_1$ includes a first end electrically connected to the battery voltage $V_{BATT}$ and a second end electrically connected to a first end of the second switch $S_2$ and to a first end of the inductor 1075. The second switch $S_2$ further includes a second end electrically connected to a ground supply $V_{GND}$ (also referred to herein as a ground voltage or ground). Although FIG. 10 illustrates a configuration of a DC-to-DC converter that is powered using a ground supply and a battery voltage, the teachings herein are applicable to DC-to-DC converters powered using any suitable power supplies. The inductor 1075 further includes a second end electrically connected to a first end of each of the third to sixth switches $S_3$-$S_6$. The third switch $S_3$ further includes a second end electrically connected to the ground supply $V_{GND}$. The fourth, fifth, and sixth switches $S_4$-$S_6$ each include a second end configured to generate the first, second, and third regulated voltages $V_{MLS1}$, $V_{MLS2}$, and $V_{MLS3}$, respectively.

The first to sixth switches $S_1$-$S_6$ are selectively opened or closed to maintain regulated voltages within a particular error tolerance of target voltage levels. Although an example with three regulated voltages is shown, the MLS DC-to-DC converter 1073 can be implemented to generate more or fewer regulated voltages.

In the illustrated embodiment, the MLS DC-to-DC converter 1073 operates as a buck-boost converter operable to generate regulated boost voltages greater than the battery voltage $V_{BATT}$ and/or regulated buck voltages lower than the battery voltage $V_{BATT}$. However, other implementations are possible.

Figure 11:
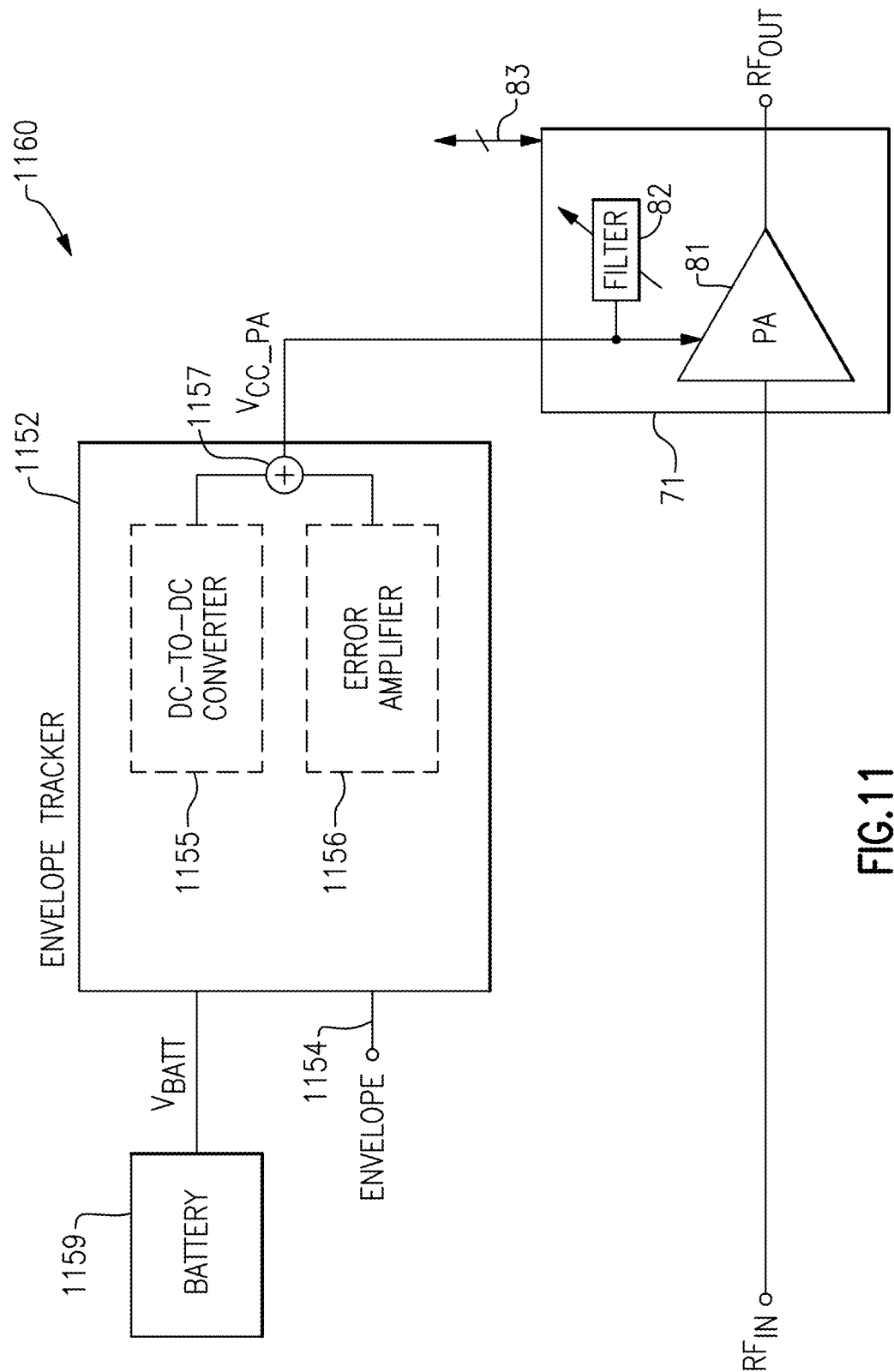
FIG. 11 is a schematic diagram of an envelope tracking system according to another embodiment.

FIG. 11 is a schematic diagram of an envelope tracking system 1160 according to another embodiment. The envelope tracking system 1160 includes a power amplifier module 71, an envelope tracker 1152, and a battery 1159. The power amplifier module 71 provides amplification to an RF input signal $RF_{IN}$ to generate an RF output signal $RF_{OUT}$, and includes a power amplifier 81 and a controllable filter 82. The power amplifier module 71 also receives data over an interface 83.

The envelope tracker 1152 receives a battery voltage $V_{BATT}$ from the battery 1159 and an envelope signal 1154 corresponding to an envelope of the radio frequency signal 1153. Additionally, the envelope tracker 1152 generates a power amplifier supply voltage $V_{CC\_PA}$, which supplies power to the power amplifier module 71.

As shown in FIG. 11, the envelope tracker 1152 includes a DC-to-DC converter 1155 and an error amplifier 1156 that operate in combination with one another to generate the power amplifier supply voltage $V_{CC\_PA}$ based on the envelope signal 1154. Additionally, an output of the DC-to-DC converter 1155 and an output of the error amplifier 1156 are combined using a combiner 1157.

In the illustrated embodiment, the DC-to-DC converter 1155 and the error amplifier 1156 operate in parallel with one another to control the voltage level of the power amplifier supply voltage $V_{CC\_PA}$. The combination of the DC-to-DC converter 1155 and the error amplifier 1156 provides effective tracking of the envelope signal 1154, since the DC-to-DC converter 1155 provides superior tracking of low frequency components of the envelope signal 1154 while the error amplifier 1156 provide superior tracking of high frequency components of the envelope signal 1154.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a radio frequency signal;
a power management system including an envelope tracker configured to generate a power amplifier supply voltage that changes in relation to an envelope of the radio frequency signal, the envelope tracker including a DC-to-DC converter configured to output a plurality of regulated voltages, a modulator configured to generate a modulator output voltage at an output based on the plurality of regulated voltages and the envelope of the radio frequency signal, and a modulator output filter coupled between the output of the modulator and the power amplifier supply voltage; and
a power amplifier module including a power amplifier configured to amplify the radio frequency signal and to receive power from the power amplifier supply voltage, the power amplifier module further including a controllable filter configured to filter the power amplifier supply voltage.

2. The mobile device of claim 1 wherein the controllable filter is operable to provide an adjustable amount of envelope tracking noise filtering.

3. The mobile device of claim 1 wherein the controllable filter includes a plurality of circuit branches that are selectable.

4. The mobile device of claim 3 wherein each of the circuit branches includes a switch for selecting the circuit branch.

5. The mobile device of claim 3 wherein the plurality of circuit branches includes a plurality of series inductor-capacitor networks.

6. A mobile device comprising:
a transceiver configured to generate a radio frequency signal;
a power management system including an envelope tracker configured to generate a power amplifier supply voltage that changes in relation to an envelope of the radio frequency signal; and
a power amplifier module including a power amplifier configured to amplify the radio frequency signal and to receive power from the power amplifier supply voltage, the power amplifier module further including a controllable filter configured to filter the power amplifier supply voltage, the controllable filter includes a plurality of circuit branches that are selectable, the plurality of circuit branches including a plurality of series resistor-inductor-capacitor networks.

7. The mobile device of claim 3 wherein the plurality of circuit branches includes a plurality of series resistor-capacitor networks.

8. The mobile device of claim 1 wherein a filtering characteristic of the modulator output filter is controllable.

9. The mobile device of claim 1 wherein the envelope tracker includes a DC-to-DC converter and an error amplifier configured to operate in parallel with one another to generate the power amplifier supply voltage.

10. A mobile device comprising:
a transceiver configured to generate a radio frequency signal;
a power management system including an envelope tracker configured to generate a power amplifier supply voltage that changes in relation to an envelope of the radio frequency signal, the envelope tracker including a DC-to-DC converter and an error amplifier configured to operate in parallel with one another to generate the power amplifier supply voltage; and
a power amplifier module including a power amplifier configured to amplify the radio frequency signal and to receive power from the power amplifier supply voltage, the power amplifier module further including a controllable filter configured to filter the power amplifier supply voltage, the error amplifier included on the power amplifier module, and the DC-to-DC converter external to the power amplifier module.

11. The mobile device of claim 10 wherein the controllable filter is operable to provide an adjustable amount of envelope tracking noise filtering.

12. The mobile device of claim 10 wherein the controllable filter includes a plurality of circuit branches that are selectable.

13. The mobile device of claim 12 wherein each of the circuit branches includes a switch for selecting the circuit branch.

14. The mobile device of claim 12 wherein the plurality of circuit branches includes a plurality of series inductor-capacitor networks.

15. The mobile device of claim 12 wherein the plurality of circuit branches includes a plurality of series resistor-capacitor networks.

16. The mobile device of claim 6 wherein the controllable filter is operable to provide an adjustable amount of envelope tracking noise filtering.

17. The mobile device of claim 6 wherein the controllable filter includes a plurality of circuit branches that are selectable.

18. The mobile device of claim 17 wherein each of the circuit branches includes a switch for selecting the circuit branch.

19. The mobile device of claim 17 wherein the plurality of circuit branches includes a plurality of series inductor-capacitor networks.

20. The mobile device of claim 17 wherein the plurality of circuit branches includes a plurality of series resistor-capacitor networks.

* * * * *